United States Patent
Teo et al.

(10) Patent No.: US 9,620,620 B2
(45) Date of Patent: Apr. 11, 2017

(54) METHODS TO STOP CONTACT METAL FROM EXTRUDING INTO REPLACEMENT GATES

(71) Applicant: TAIWAN SEMICONDUCTOR MANUFACTURING COMPANY, LTD., Hsinchu (TW)

(72) Inventors: Lee-Wee Teo, Singapore (SG); Ming Zhu, Singapore (SG); Chi-Ju Lee, Guiren Township (TW); Sheng-Chen Chung, Jhubei (TW); Kai-Shyang You, Jhubei (TW); Harry-Hak-Lay Chuang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 509 days.

(21) Appl. No.: 13/962,180

(22) Filed: Aug. 8, 2013

(65) Prior Publication Data

US 2013/0323919 A1 Dec. 5, 2013

Related U.S. Application Data

(62) Division of application No. 12/713,395, filed on Feb. 26, 2010, now Pat. No. 8,525,270.

(51) Int. Cl.
| | |
|---|---|
| *H01L 21/70* | (2006.01) |
| *H01L 29/66* | (2006.01) |
| *H01L 21/8238* | (2006.01) |
| *H01L 29/78* | (2006.01) |
| *H01L 29/49* | (2006.01) |

(52) U.S. Cl.
CPC ........ *H01L 29/66545* (2013.01); *H01L 21/823842* (2013.01); *H01L 29/78* (2013.01); *H01L 29/4966* (2013.01)

(58) Field of Classification Search
CPC ....... H01L 29/66545; H01L 21/823842; H01L 29/4966; H01L 29/78
See application file for complete search history.

(56) References Cited

U.S. PATENT DOCUMENTS

| | | | |
|---|---|---|---|
| 2007/0037343 A1* | 2/2007 | Colombo | ........ H01L 21/823842 438/231 |
| 2008/0087966 A1* | 4/2008 | Tai | .................. H01L 21/823842 257/369 |
| 2009/0050886 A1* | 2/2009 | Lee | ........................ G11C 29/24 257/48 |
| 2009/0242997 A1 | 10/2009 | Yu et al. | |
| 2010/0124818 A1 | 5/2010 | Lee et al. | |

FOREIGN PATENT DOCUMENTS

TW 200826169 6/2008

* cited by examiner

*Primary Examiner* — Meiya Li
(74) *Attorney, Agent, or Firm* — Hauptman Ham, LLP

(57) ABSTRACT

A method of preventing contact metal from protruding into neighboring gate devices to affect work functions of the neighboring gate devices is provided includes forming a gate structure. Forming the gate structure includes forming a work function layer, and forming a gate metal layer having a void, wherein the work function layer surrounds the gate metal layer. The method further includes forming a contact plug having a contact metal directly on the gate metal layer of the first gate stack, wherein the contact metal protrudes into the void, and the work function layer prevents the contact metal from protruding into a second gate stack.

20 Claims, 17 Drawing Sheets

METHODS TO STOP CONTACT METAL FROM EXTRUDING INTO REPLACEMENT GATES

PRIORITY CLAIM

The present application is a divisional of U.S. application Ser. No. 12/713,395, filed Feb. 26, 2010, the disclosure of which is incorporated herein by reference in its entirety.

FIELD

This application relates to metal extrusion and, more particularly, to contact metal extruding into replacement gates.

BACKGROUND

The semiconductor integrated circuit (IC) industry has experienced rapid growth. Technological advances in IC materials and design have produced generations of ICs where each generation has smaller and more complex circuits than the previous generation. Such advances have increased the complexity and challenges of processing and manufacturing of ICs.

In the course of IC evolution, functional density (i.e., the number of interconnected devices per chip area) has generally increased while critical dimensions (i.e., the smallest components (lines, or openings) that can be created using a fabrication process) have decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

However, problems arise when integrating a high-k/metal gate feature in a CMOS process flow. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1A:
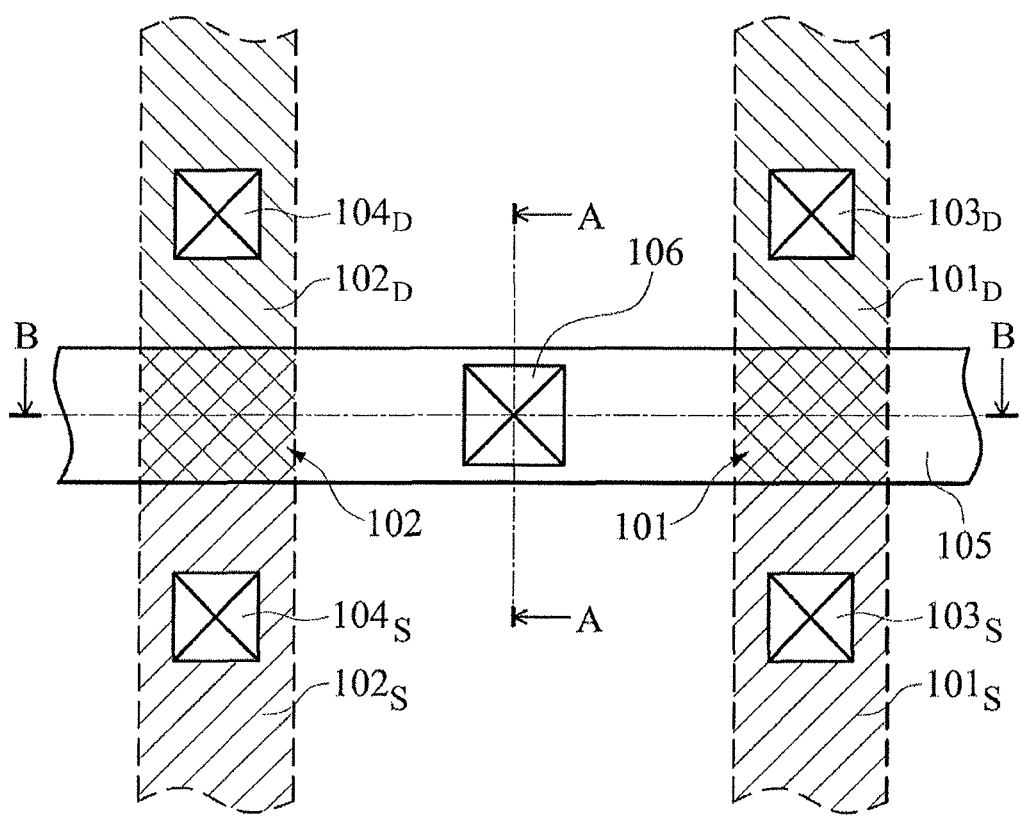
FIG. 1A shows a top layout view of a portion of a SRAM cell, in accordance with one embodiment of this disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1A shows a top layout view of a portion of a SRAM cell, in accordance with one embodiment of this disclosure.

The SRAM cell includes a pulldown gate 101 and a pass gate 102. In this embodiment, both gates 101 and 102 are N-type field-effect transistors (nFETs). There are source regions $101_S$ and $102_S$ on one side of the pulldown gate 101 and the pass gate 102, and drain regions $101_D$ and $102_D$ on the other side of the pulldown gate 101 and the pass gate 102. There are contact plugs $103_S$ and $104_S$ on each of the source regions, and $103_D$ and $104_D$ on each of the drain regions. The contact plugs $103_S$, $103_D$, $104_S$, and $104_D$ are drawn in square shapes in layout. In some embodiments, contact plugs $103_S$, $103_D$, $104_S$, and $104_D$ are circular-shaped after being exposed and patterned on the substrate.

FIG. 1A also shows a horizontal word line 105, which provides access to the SRAM cells. During the creation of gate structures, such as gates 101 and 102, word line 105 is initially deposited with a dummy polysilicon layer, which is replaced with other materials, such as aluminum (Al) gate metal and a N-type work function material during subsequent substrate processing. Both the pulldown gate 101 and the pass gate 102 are part of the word line 105. The portion of word line 105 between gate 101 and gate 102 functions as local interconnect between these two gates. There is a contact plug 106 over the portion of word line 105 between gates 101 and 102.

Figure 1B:
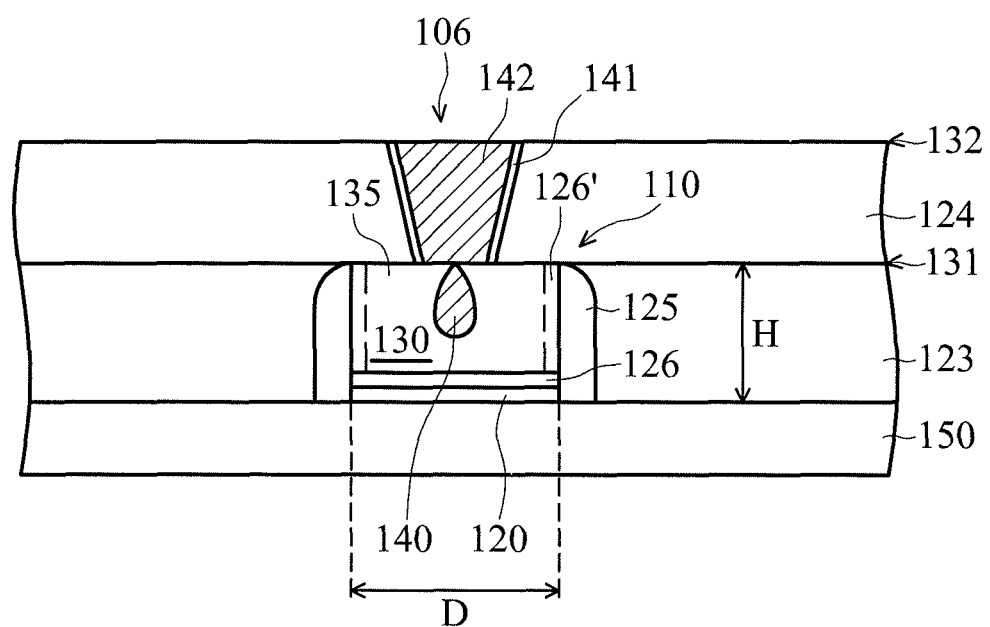
FIG. 1B shows a cross sectional view along AA line of FIG. 1A, in accordance with one embodiment of this disclosure.

FIG. 1B shows a cross sectional view along AA line of FIG. 1A, in accordance with one embodiment of this disclosure. AA line of FIG. 1A cuts along the center of contact plug 106. FIG. 1B shows a gate stack 110 of the word line 105, and the contact plug 106. The gate stack 110 includes an interfacial layer 120. In some embodiments, the interfacial layer 120 may include a dielectric sub-layer, such as silicon oxide ($SiO_2$), a high dielectric constant (high-K) dielectric sub-layer, and a barrier sub-layer. The interfacial layer 120 may optionally include HfSiO or SiON. The silicon oxide sub-layer is deposited on the surface (silicon surface) of substrate 150. The high-K dielectric sub-layer is deposited over the SiO2 sub-layer, and the barrier sub-layer is over the high-K dielectric sub-layer. The high-k dielectric sub-layer may include a binary or ternary high-k film such as $HfO_x$. In alternative embodiments, the high-k dielectric sub-layer may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides, or other suitable materials. The barrier sub-layer may include a metal film such as TiN or TaN. In alternative embodiments, the barrier sub-layer may optionally include $Si_3N_4$.

The gate stack 110 may also include an N-type work function (N-metal) layer 126. In one embodiment, the thickness of the N-type work function layer 126 ranges from about 10 to about 100 angstroms (Å). The N-metal 126 may include a layer of TiAl. The N-metal layer 126 may be formed by Atomic Layer Deposition (ALD), Physical Vapor Deposition (PVD), Chemical Vapor Deposition (CVD), or other suitable process. In alternative embodiments, the N-metal layer 126 may optionally include other suitable metals, such as Ti, Ag, Al, TiAlN, TaC, TaCN, TaSiN, Mn, or Zr. Further, the N-metal layer 126 may also include a multi-metal layer structure. Other examples of materials for an N-type work function layer include, but not limited to, La, Zr, Hf, V, Nb, Ta, Ti, or metal carbides. In some embodiments, the work function material includes impurities. In some embodiments, the impurities used in providing the N-type work function shift are made of an element from the Lanthanide group.

In one embodiment, the N-type work function layer 126 only covers the surface of the interface layer 120. In another embodiment, the N-type work function layer 126 also covers the sidewalls of the opening 130 enclosed by a pair of sidewalls 125 (such as layer 126' that covers the side walls). The remaining of the opening 130 is filled by a gate metal film 135, such as Al, with a void 140 in some cases. The void 140 is formed as a result of poor gapfill of the gate metal film 135 in opening 130. The deceasing gate width "D" of the gate stack 110 and the increasing aspect ratio (H/D, where H is the height of the gate stack 110, make gapfill of the gate metal film 135 in opening 130 more difficult. The void 140 becomes at least partially filled with the contact metal film used to fill the contact plug 106. In one embodiment, the metal film used to fill the contact plug 106 is tungsten (W) deposited by chemical vapor deposition (CVD). Other types of metal can also be used to fill the contact plug.

In an exemplary embodiment, Tungsten is used as the metal to fill contact plug 106. During tungsten deposition, the tungsten deposed by CVD process can protrude into void 140. The contact plug 106 can be lined with an adhesion layer 141. In one embodiment, the adhesion layer 141 is made of Ti, TiN, or a combination Ti and TiN (Ti/TiN). The adhesion layer 141 can be deposited by physical vapor deposition (PVD), CVD, or atomic layer deposition (ALD). In FIG. 1B, film 123 and film 124 are made of one or more dielectric materials.

Figure 1C:
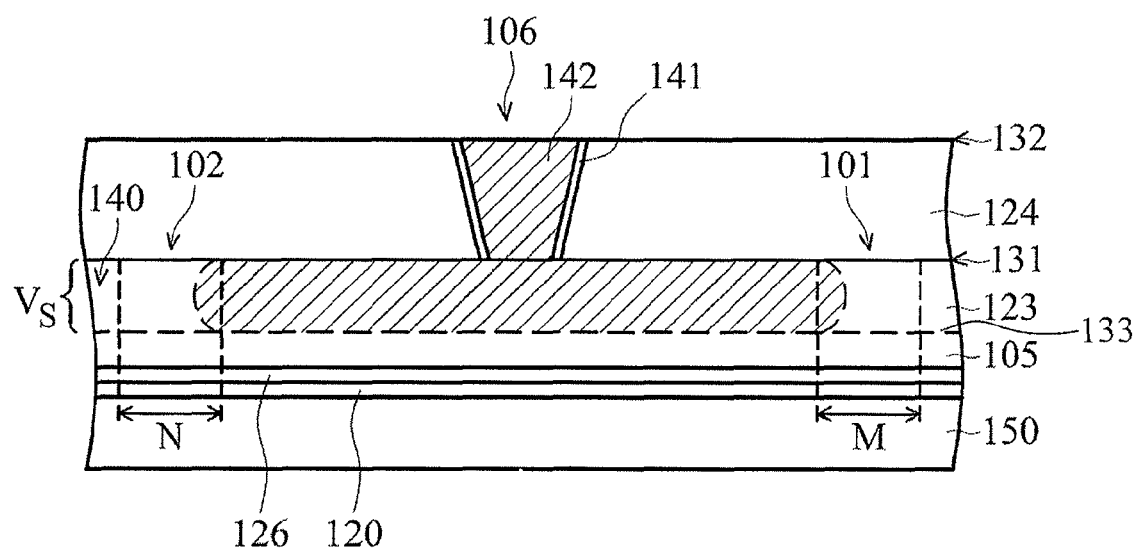
FIG. 1C shows a cross sectional view along BB line of FIG. 1A, in accordance with one embodiment of this disclosure.

FIG. 1C shows a cross sectional view along BB line of FIG. 1A, in accordance with one embodiment of this disclosure. BB line of FIG. 1A cuts along the center of contact plug 106, runs along the word line 105, and is perpendicular to AA line. FIG. 1C shows that void 140 extends along the entire length of word line 105 and is shown in region "Vs", which is between a line 131 along the surface of the gate stack 101 and a line 133 along the bottom of void 140. During CVD tungsten deposition, tungsten extrudes into the region 145 of void 140 under the contact plug 106 and fill region 145 at least partially with W. In FIG. 1C, region 145 extends at least partially into gate 101 and 102 and can extend into the entire cross sections (regions M and N) of gates 101 and 102 in some embodiments. The deposition of the tungsten into the void 140 can alter the work function of nFETs of gates 101 and 102 and can result in increase in minimal Vcc (or Vcc min) of the SRAM due to high Vt (threshold voltage) of pass gate devices. An increase in Vcc min and Vt would impact the performance of SRAM. In some embodiments, the work function increases by an amount between about 100 mV to about 300 mV. An increase in the work function could also reduce the "on" current (Ion) for the pass gate. Further, an increase in work function could also cause a mismatch between devices. Therefore, it's important to find means to prevent such contact metal extrusion.

Figure 1D:
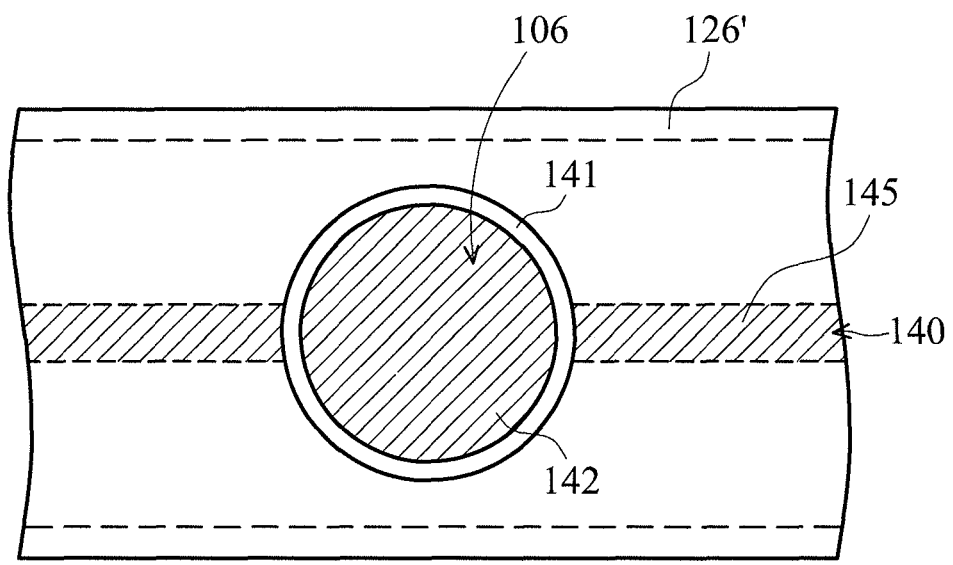
FIG. 1D shows a top view of a portion of FIG. 1C near a contact plug, in accordance with one embodiment of this disclosure.

FIG. 1D shows a top view of a portion of FIG. 1C near a contact plug 106, in accordance with one embodiment of this disclosure. FIG. 1D shows an optional N-type work function layer 126' deposited on the sidewalls of gate stack 110. N-type work function layer 126' is called optional because the N-type work function layer 126 might only cover the bottom surface, as shown in FIG. 1B. FIG. 1D shows a dotted lined region 145, which is at least a portion of laterally formed void 140 that is deposited with W.

Figure 2A:
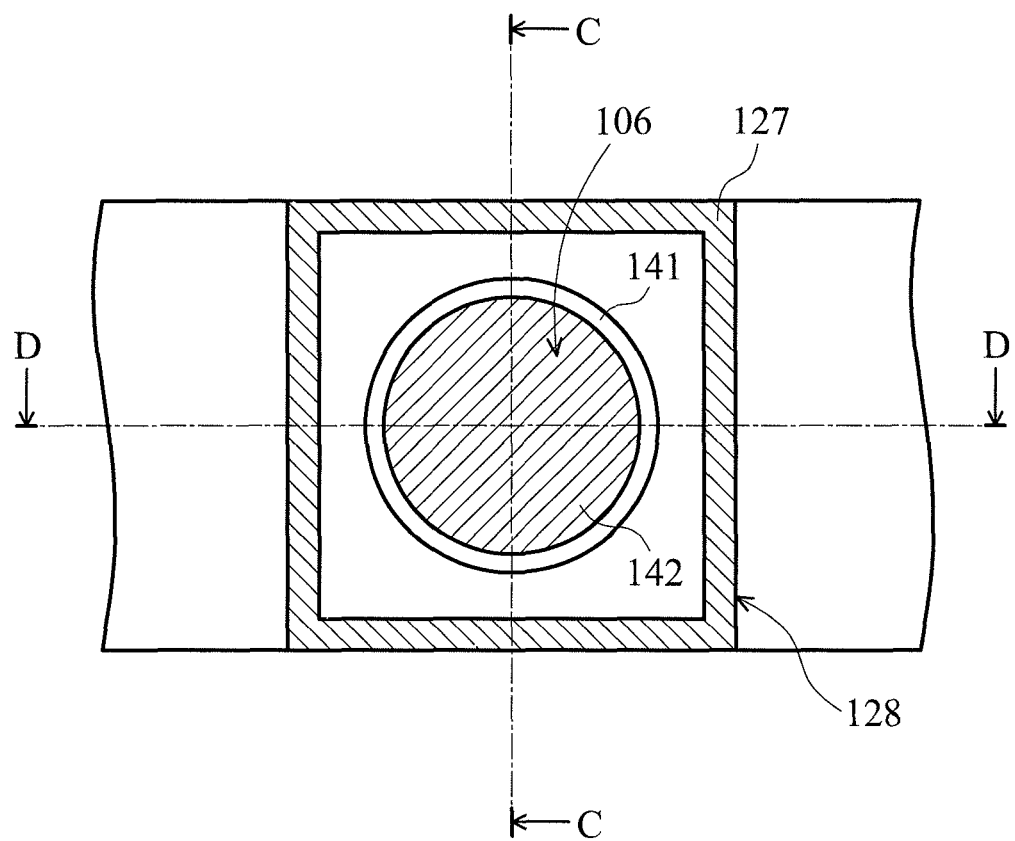
FIG. 2A shows a top view of the same region of FIG. 1C when the contact plug is surrounded by a P-type work function layer, in accordance with one embodiment of this disclosure.

FIG. 2A shows a top view of the same region of FIG. 1D when the gate metal 135 underneath and surrounding the contact plug 106 is enclosed by a P-type work function (P-metal) layer 127, in accordance with one embodiment of this disclosure. In one embodiment, the P-metal 127 is a layer of TiN, which has a thickness ranging from about 10 to about 200 angstroms (Å). The P-metal layer 127 may be formed by ALD, PVD, CVD, or other suitable process. The P-metal layer 127 should provide sufficient coverage on the sidewalls of the rectangular boundary 128 to prohibit the formation of an elongated void, such as void 140, in the gate metal 135. Tungsten disposed by CVD process from the contact plug 106 would be blocked by the gate metal 135 and the P-metal layer 127 surrounding the contact plug 106.

ALD process has good step coverage and could be considered as a good process for depositing layer 127. In one embodiment, a minimal thickness of layer 127 on the sidewalls of the openings is about 10 Å. In alternative embodiments, the P-metal layer 127 may optionally include other suitable metals, such as WN, TaN, or Ru that properly perform in the pFETs. Further, the P-metal layer 127 may also include a multi-metal layer structure such as TiN/WN. In some embodiments, P-type work function materials may include, but not limited to, Re, Fe, Co, Rh, Ir, Ni, Pd, or Pt. Further, Pd could be used as an impurity in a P-type work function layer.

Figure 2B:
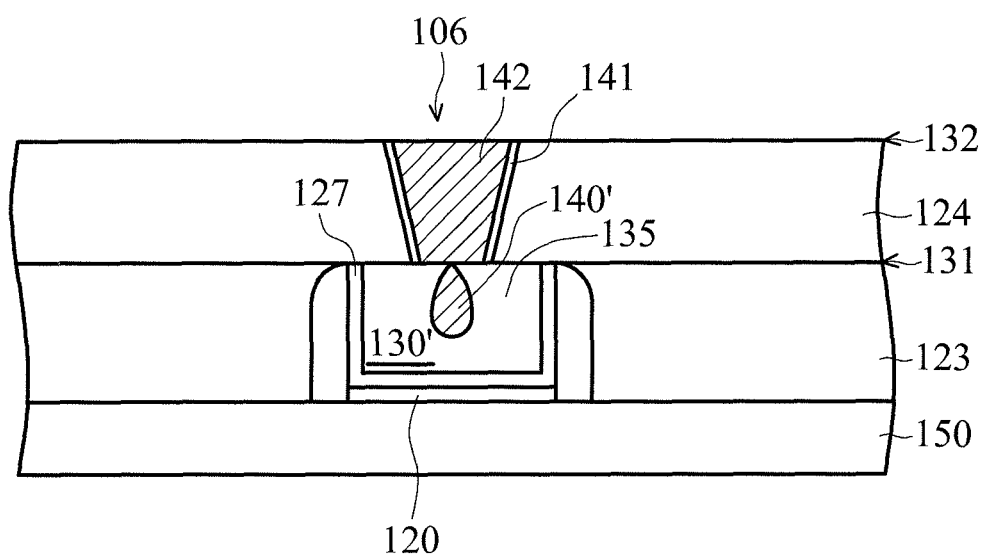
FIG. 2B shows a cross sectional view of FIG. 2A cut along CC line, in accordance with one embodiment of this disclosure.

As mentioned above, the P-type work function layer 127 that surrounds the contact plug 106 prevents the formation of laterally elongated void, such as void 140, and prevents tungsten disposed by CVD process from extruding beyond the rectangular boundary 128 of the P-type work function layer 127. FIG. 2B shows a cross sectional view of FIG. 2A cut along CC line, in accordance with one embodiment of this disclosure. FIG. 2B shows that a cross-section that is very similar to FIG. 1B, with the exception of N-type work function layer 126 (and the optional portion 126') being replaced by a P-type work function layer 127, which cover the sidewalls of opening 130' and interfacial layer 120. The remaining of the opening 130' is filled by the gate metal film 135, such as Al, with a void 140' under certain circumstances. The void 140' is formed as a result of poor gapfill of the gate metal film 135 and high aspect ratio of opening 130' (within the confinement of layer 127). Similar to void 140 in FIG. 1B, void 140' becomes at least filled with the metal film, such as W, used to fill the contact plug 106.

The P-type work function layer 127 should provide good sidewall coverage to ensure contact metal (such as W) does not protrude through sidewall(s) to the neighboring nFET gate layers. In one embodiment, the P-type work function layer 127 is deposited by atomic layer deposition (ALD), which provides good step coverage. In one embodiment, the P-type work function layer 127 is deposited with a minimal thickness of about 10 Å to cover the sidewalls and bottom surface of opening 130'. The minimal thickness ensure sufficient coverage of the sidewalls to prevent contact metal from protruding into neighboring gate stack(s) to affect the work function of the neighboring device. In some embodiments, the thickness of layer 127 (measured at the top surface of the substrate) is between about 10 Å to about 200 Å.

Figure 2C:
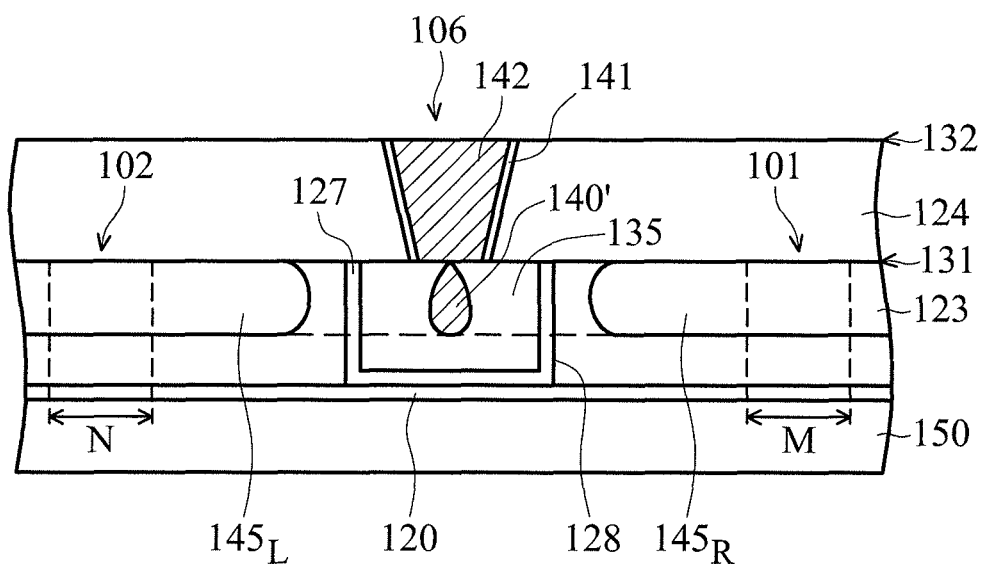
FIG. 2C shows a cross sectional view of FIG. 2A cut along DD line, in accordance with one embodiment of this disclosure.

FIG. 2C shows a cross sectional view of FIG. 2A cut along DD line, in accordance with one embodiment of this disclosure. In contrast to FIG. 1C, the void 140' is contained within a region below contact plug 106 and surrounded by film 135 and P-type work function layer 127. Void 140' is at least partially filled with tungsten. Even if the void 140' is fairly large, void 140' and the tungsten material within void 140' are contained by the by film 135 and P-type work function layer 127 and cannot protrude laterally along word line 105. On the right side of the region defined by boundary 128, there could be a void $145_R$, formed as a result of poor gap fill by gate metal film 135. Similarly, on the left side of the region defined by boundary 128, there could be a void $145_L$, formed as a result of poor gap fill by gate metal film 135. However, since tungsten protrusion is limited by boundary 128, voids $145_R$ and $145_L$ remain voids and are not deposited with W.

Figure 3:
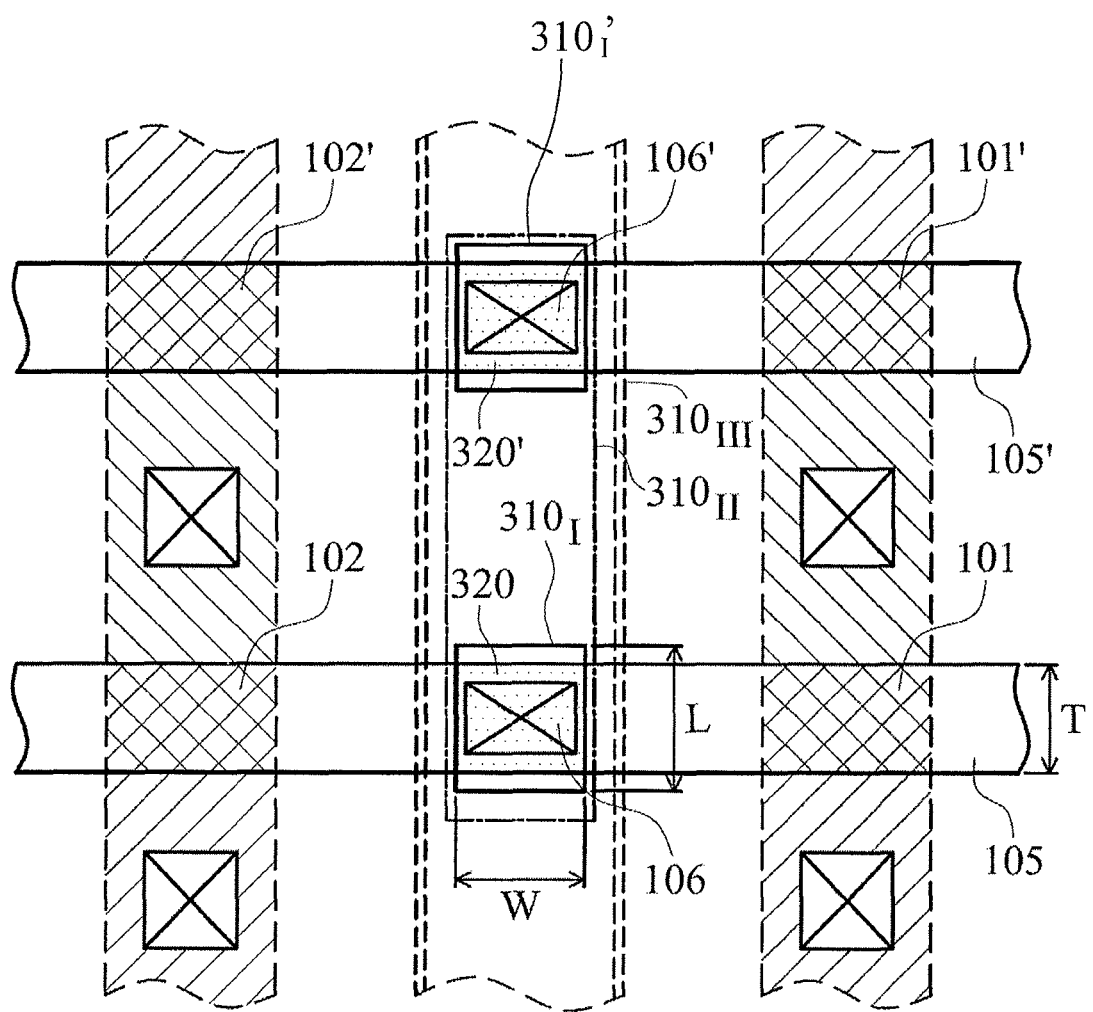
FIG. 3 shows a top layout view of a portion of another static random access memory (SRAM) cell, in accordance with another embodiment of this disclosure.

FIG. 3 shows a top layout view of a portion of a SRAM cell 100', in accordance with one embodiment of this disclosure. SRAM cell 100' is very similar to SRAM cell 100 of FIG. 1A and includes an additional word line 105'. Word line 105' has two nFETs, 101' and 102', and a contact 106'. As mentioned above, gates 101 and 102 are also nFETs. In one embodiment, an opening $310_I$ of a photomask (not shown) is used to open a dotted region 320 of the word line underneath and surrounding the contact 106 and an opening $310_I'$ of a photomask (not shown) is used to open a dotted region 320' of the word line underneath and surrounding the contact 106'. Openings $310_I$ and $310_I'$ are rectangular-shaped. The length of opening $310_I$ is "L" and the width of opening $310_I$ is "W", as shown in FIG. 3. In one embodiment, L is larger than the width of contact 106. "L" can be larger or smaller than "T" of word line 105. In one embodiment, "W" (width) is also larger than the largest diameter (or width) of contact 106. Opening $310_I$ needs to be large enough to encompass (or encircle) an area under the entire opening of contact plug 106 to allow the contact plug 106 to land on a gate metal 135 surrounded by a P-type work function layer 127, as shown in FIGS. 2A-2C. $310_I'$ is designed by following guidelines similar to $310_I$. The photomask that includes openings $310_I$ and $310_I'$ are used to remove dummy polysilicon in the openings to allow the deposition of P-type work function layer, such as layer 127, as described above.

In other alternative embodiments, openings $310_I$ and $310_I'$ can be larger than minimally required area and can be combined into a larger opening, such as $310_{II}$, or $310_{III}$. Opening $310_{II}$ exposes dummy polysilicon under contacts 106 and 106'. In another embodiment, an opening $310_{III}$ is used. Opening $310_{III}$ encompasses an area under contact plug 106, as described above, and multiple contact plugs similar to contact plug 106 (more than contact plugs 106 and 106').

Figure 4A:
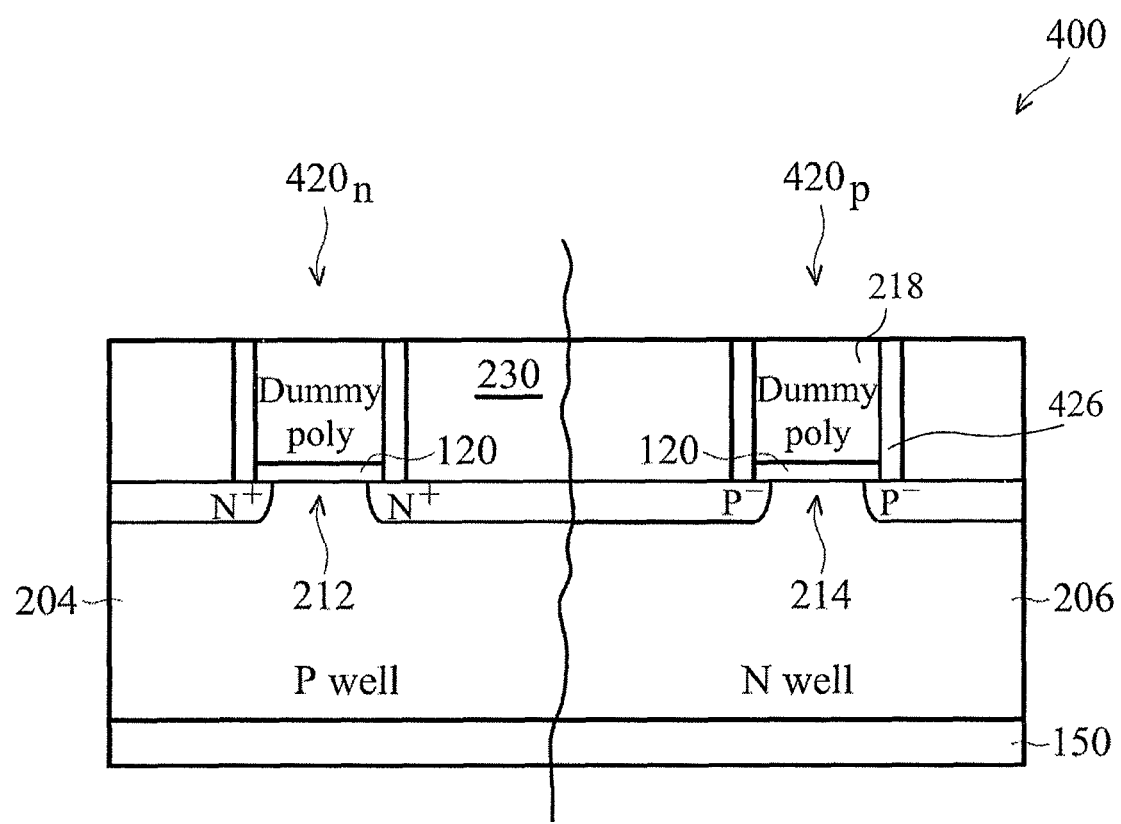
FIG. 4A shows a cross sectional view of a semiconductor device region, in accordance with one embodiment of this disclosure.

FIG. 4A shows a cross sectional view of a semiconductor device region 400, in accordance with one embodiment of this disclosure. In FIG. 4A, the semiconductor device region 400 includes a semiconductor substrate 150, such as a silicon substrate. The substrate 150 may further include doped regions such as a P-well 204 and N-well 206. The semiconductor device region 400 may further include an isolation structure(s) (not shown) for isolating active regions 212 and 214 of the substrate. The active region 212 may be configured for an NMOS device (e.g., nFET) and the active region 214 may be configured for a PMOS device (e.g., pFET).

The semiconductor device region 400 includes a gate structure 420n in the nFET 212 device side and a gate structure 420p in the pFET 214 device side. The gate structures 420n, 420p may each includes an interfacial layer 120 formed over the substrate 150. As described above, the interfacial layer 120 may include a dielectric sub-layer, such as a silicon oxide ($SiO_2$) sub-layer, a high dielectric constant (high-K) dielectric sub-layer, and a barrier sub-layer. The dielectric sub-layer may optionally include HfSiO or SiON. The high-k dielectric sub-layer may include a binary or ternary high-k film such as $HfO_x$. In alternative embodiments, the high-k dielectric sub-layer may optionally include other high-k dielectrics. The barrier sub-layer may include a metal film such as TiN or TaN. In alternative embodiments, the barrier sub-layer may optionally include $Si_3N_4$. The barrier sub-layer may function as a barrier between the high-k dielectric sub-layer and a subsequent dummy poly gate structure. The barrier sub-layer may help reduce or eliminate the risk of Fermi level pinning between the poly and the high-k dielectric sub-layer during subsequent processing. Also, the barrier sub-layer may function as a etch stop layer and protection layer during removal of the dummy poly gate as discussed later below. It should be noted that, in some embodiments, the interfacial layer 120 may be formed in a gate last process. The semiconductor device region 400 may further include a dummy polysilicon (or poly) layer 218 formed over the interfacial layer 120 by a suitable deposition process.

Figure 4B:
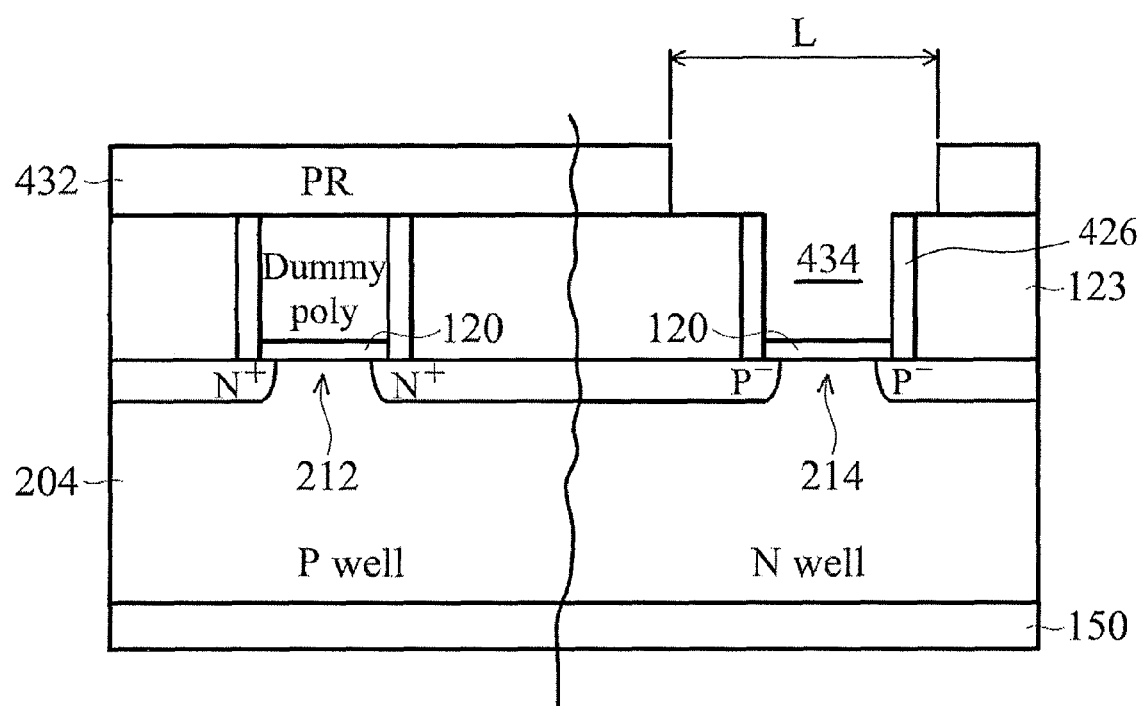
FIG. 4B shows a patterned photoresist layer formed to protect an nFET (N-type field effect transistor) gate structure, in accordance with one embodiment of this disclosure.

FIG. 4A may also include the various features, such as lightly doped source/drain regions (n-type and p-type LDD regions), sidewall or gate spacers 426, source/drain (S/D) regions (n-type and p-type S/D regions), silicide features, contact etch stop layer (CESL), and an interlayer dielectric (ILD) 230, and/or shallow trench isolation. The deposition of the ILD 230 fills in the gaps between the adjacent gate structures 420n, 420p of the nFET 212 and pFET 214 devices, respectively. FIG. 4B shows a patterned photoresist layer 432 formed to protect the gate structure 420n, in accordance with one embodiment of this disclosure. The mask used to form the pattern of patterned photoresist layer 432 is the photomask with opening $310_I$ (or $310_{II}$, $310_{III}$, $310_{IV}$) described above in FIG. 3. The length "L" of FIG. 3 is shown in FIG. 4B. The dummy poly gate 218 in the gate structure 420p of the pFET 214 side may be removed by a dry etching, wet etching, or combination dry and wet etching process. The dummy poly gate 218 is removed to form a trench 434 in the gate structure 420p in the pFET 214 side. The patterned photoresist layer 432 is removed afterwards by ashing, stripping or other suitable processes.

Figure 4C:
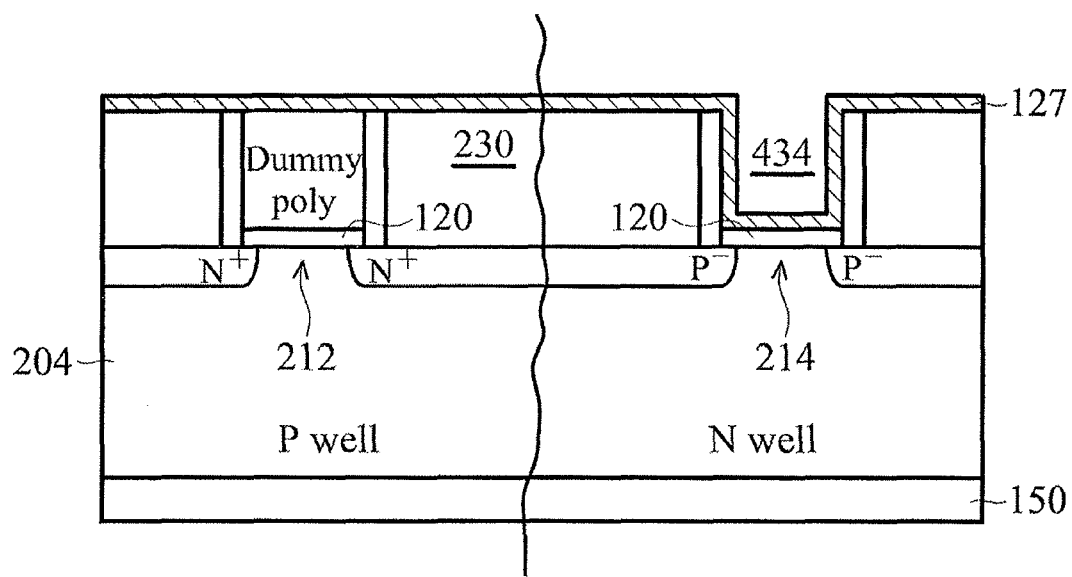
FIG. 4C shows a P-type work function metal layer being formed to partially fill in an opening in a pFET gate structure, in accordance with one embodiment of this disclosure.
Figure 4D:
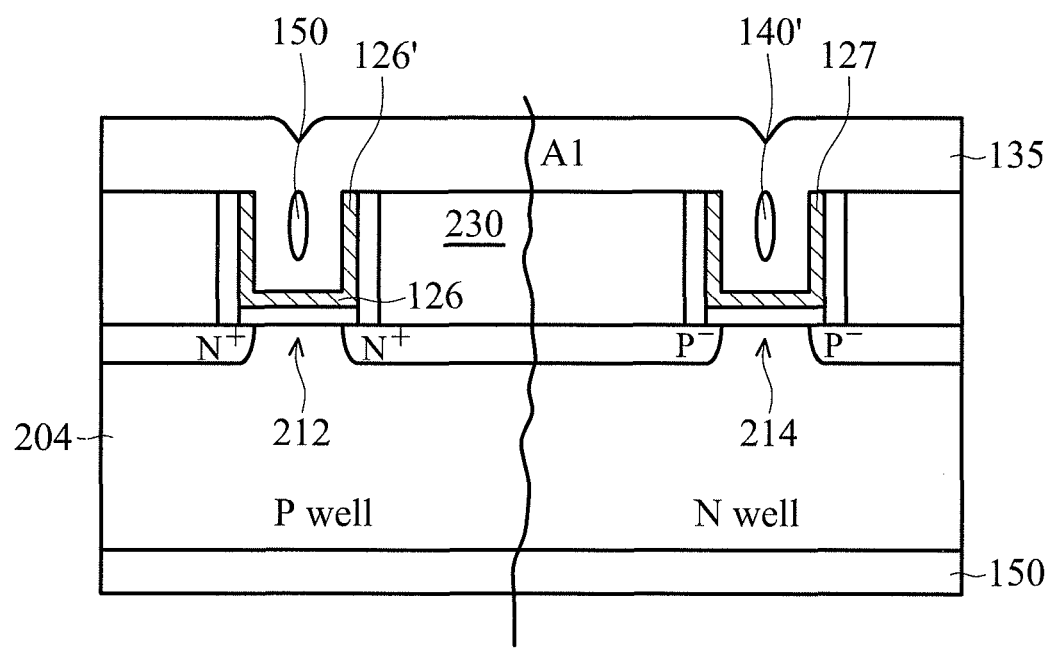
FIG. 4D shows a void formed in the opening of pFET device and a void formed in the opening of nFET device, in accordance with one embodiment of this disclosure.
Figure 4E:
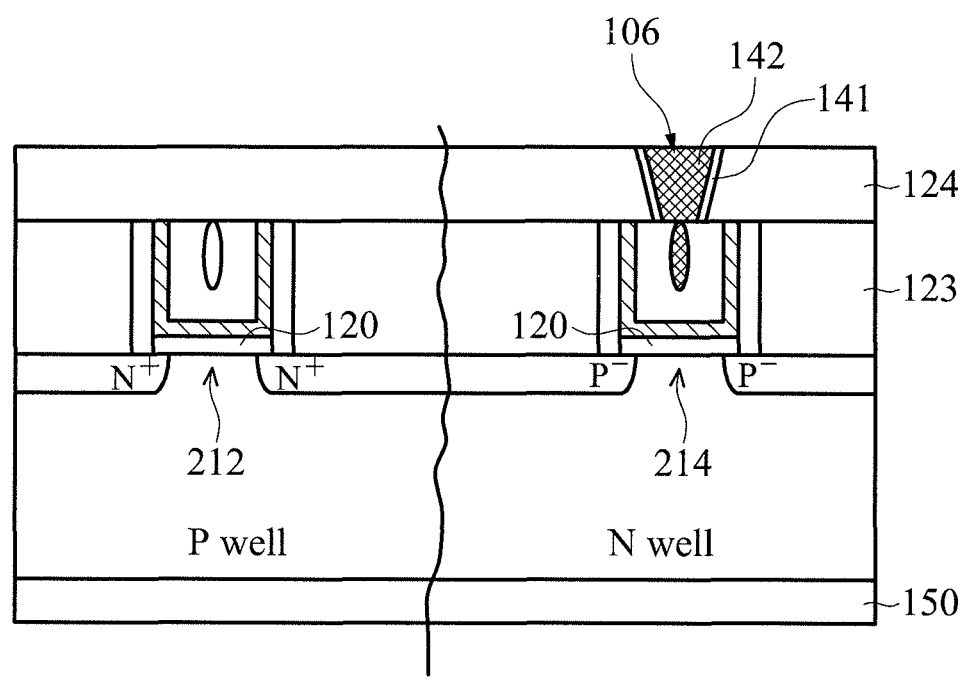
FIG. 4E shows contact plugs are formed on the semiconductor device region, in accordance with one embodiment of this disclosure.
Figure 4F:
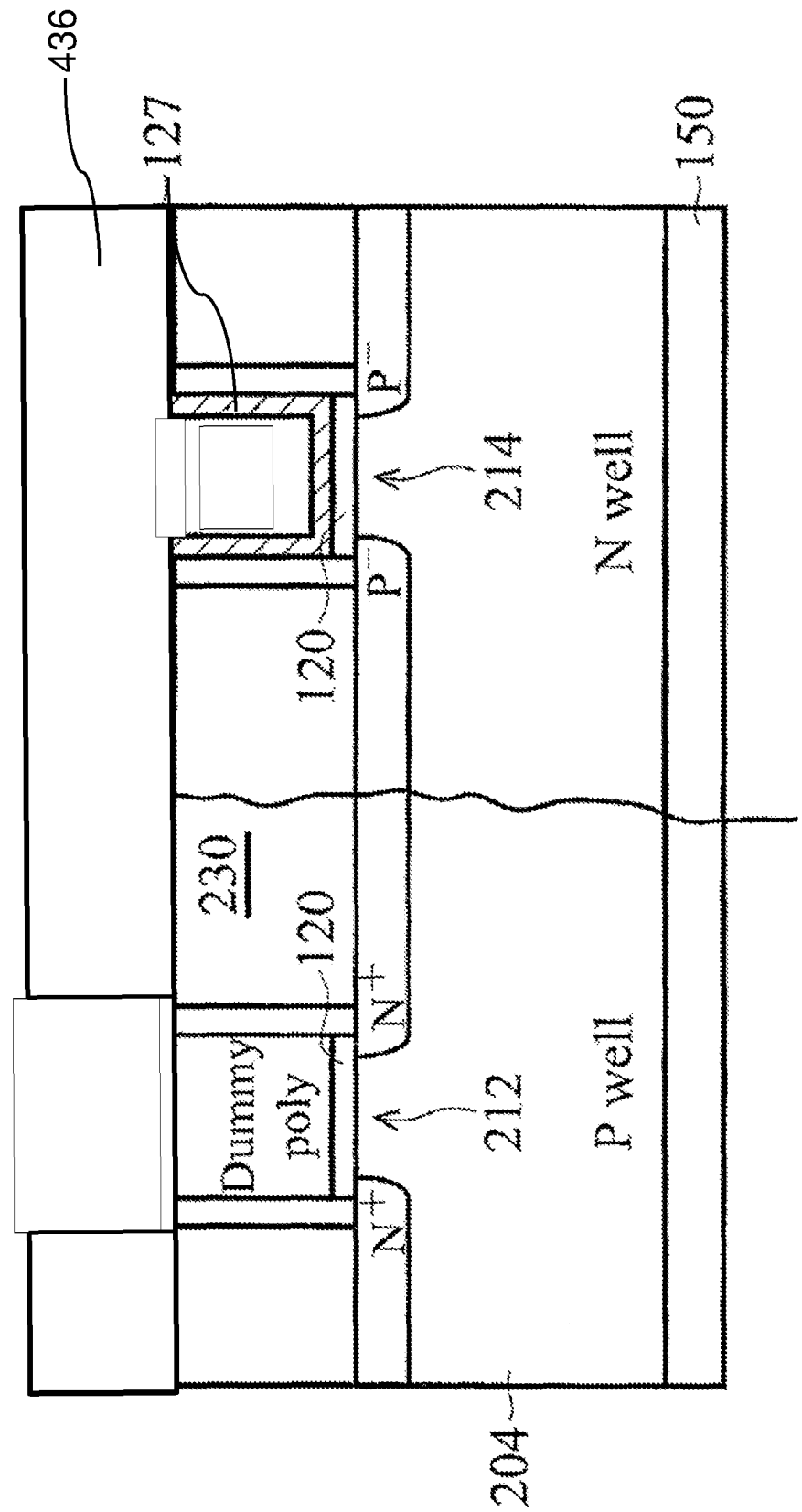
FIG. 4F shows a photoresist exposing a dummy polysilicon of an nFET gate structure, in accordance with one embodiment of this disclosure.

FIG. 4C shows a P-type work function metal (P-metal) layer 127 being formed to partially fill in an opening 434 in the pFET gate structure 420p, in accordance with one embodiment of this disclosure. In some embodiments, the P-metal layer 127 may be a layer of TiN and may have a thickness ranging from about 10 to about 100 Å (angstroms). The P-metal layer 127 may be formed by ALD, PVD, CVD, or other suitable process. As mentioned above, ALD has good step coverage and could be considered as a good process for depositing layer 127 to provide good sidewall coverage. In alternative embodiments, the P-metal layer 127 may optionally include other suitable metals, such as WN, TaN, or Ru, that properly perform in the pFET 214. Further, the P-metal layer 127 may also include a multi-metal layer structure such as TiN/WN. P-metal work function metal layer 127 is deposited, additional substrate processing is performed to deposit the N-type work function layer 126 (with or without sidewall covering layer 126') in the nFET 212. FIG. 4F shows a photoresist 436 exposing a dummy polysilicon 218 in the gate structure 420n of nFET 212.

After the P-type and N-type work function layers, layer 127 and layer 126 (with or without side wall coverage of layer 126') respectively, are deposited, the gate metal layer 135 is deposited. As mentioned above, an exemplary gate metal material is Al (aluminum). In FIG. 4D, under certain circumstances, there is a void 140' formed in the opening 434 and there may be a void 150 formed in the opening created after dummy polysilicon is removed from the nFET gate structure, in accordance with one embodiment of this disclosure. In some embodiments, if N-type work function layer 126 covers the sidewall of opening 434 (layer 126' of FIG. 4D), a void 150 is likely formed due to higher aspect ratio of the opening. In other embodiments, if N-type work function layer 126 only covers the bottom surface of opening 434, a void 150 is less likely to be formed or a small void 150 could be formed. FIG. 4E shows contact plugs are formed on the semiconductor device region 400, in accordance with one embodiment of this disclosure. FIG. 4E shows that the gate metal layer 135 above the gate structures 420n, 420p is removed. Another ILD layer 124 is deposited and etched to form contact openings, which are filled by an adhesion layer 141 and a contact metal layer 142. The contact metal above the contact plugs, such as plug 106, is removed. During the deposition of contact metal, such as tungsten, the contact metal protrudes into voids, such as void 140', beneath the contact plug 106. In contrast, void 150 is not filled, since it is not under or near a contact plug. Due to the surrounding P-type work function layer 127 and the gate metal layer 135 according to disclosed embodiments, the tungsten in void 140' does not protrude (or extend) laterally into the gate stack(s) (or gate metal) of adjacent nFET devices, as described above.

The process sequences shown in FIGS. 4A-4E indicate that dummy polysilicon of pFET devices is removed first and dummy polysilicon of nFET devices is removed later. In other alternative embodiments, dummy polysilicon of nFET devices can be removed first and dummy polysilicon of pFET devices can be removed afterwards.

FIGS. 1A and 3 show that contact plug 106 is placed on a word line 105 of an SRAM and the contact plug 106 is placed between two nFET devices. However, the embodiments described above can also apply to contact plugs not placed on word lines of and between two nFET devices. The embodiments described above may also apply to contact plugs placed adjacent to pFET device(s) that share the same polysilicon regions under the contact plugs. The dummy polysilicon under the contact plugs can also be removed in a manner similar to those described above when the dummy polysilicon for nFET is removed. The openings of removed dummy polysilicon can be deposited with an N-type work function layer (instead of P-type work function layer) that has good sidewall coverage of the openings. The N-type work function layer could prevent the contact metal (such as tungsten) from protruding into gate stacks of nearby pFET devices in a same manner described above for nFETs.

Figure 5A:
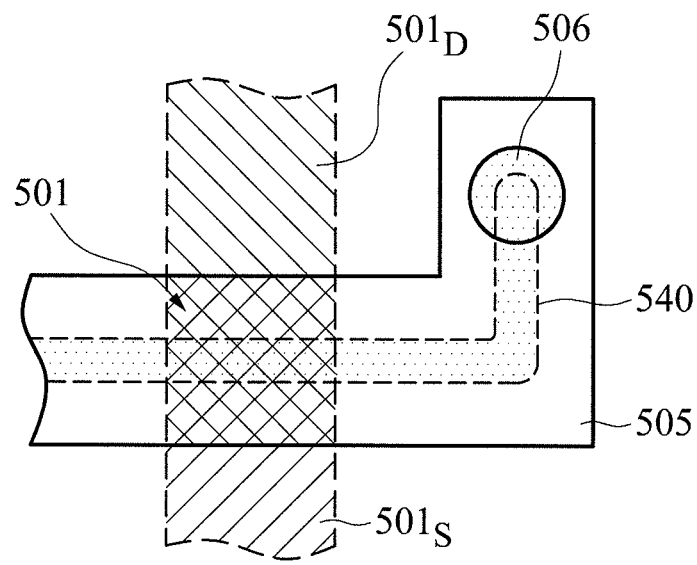
FIG. 5A shows a top view of a contact plug landed on a gate metal line that is used for local interconnect and is adjacent to a gate structure, in accordance with one embodiment of this disclosure.
Figure 5B:
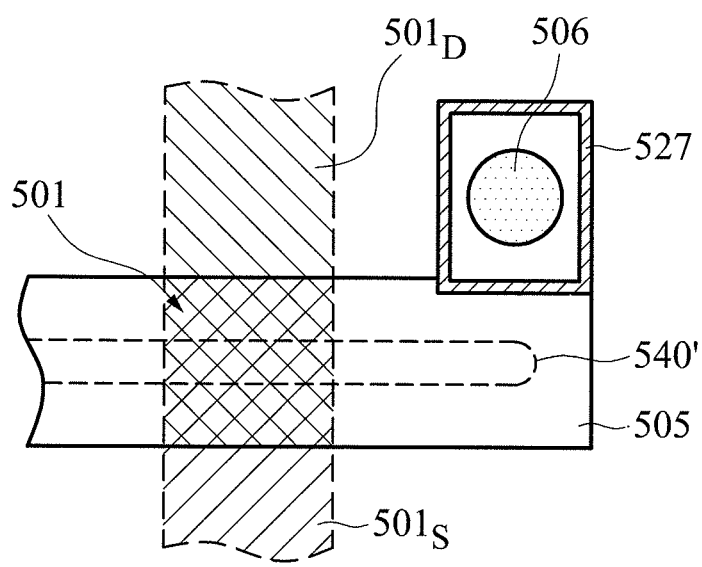
FIG. 5B shows the dummy polysilicon surrounding contact plug having been removed and the opening created being lined with a work function layer with good sidewall coverage, in accordance with an embodiment of this disclosure.
Figure 5C:
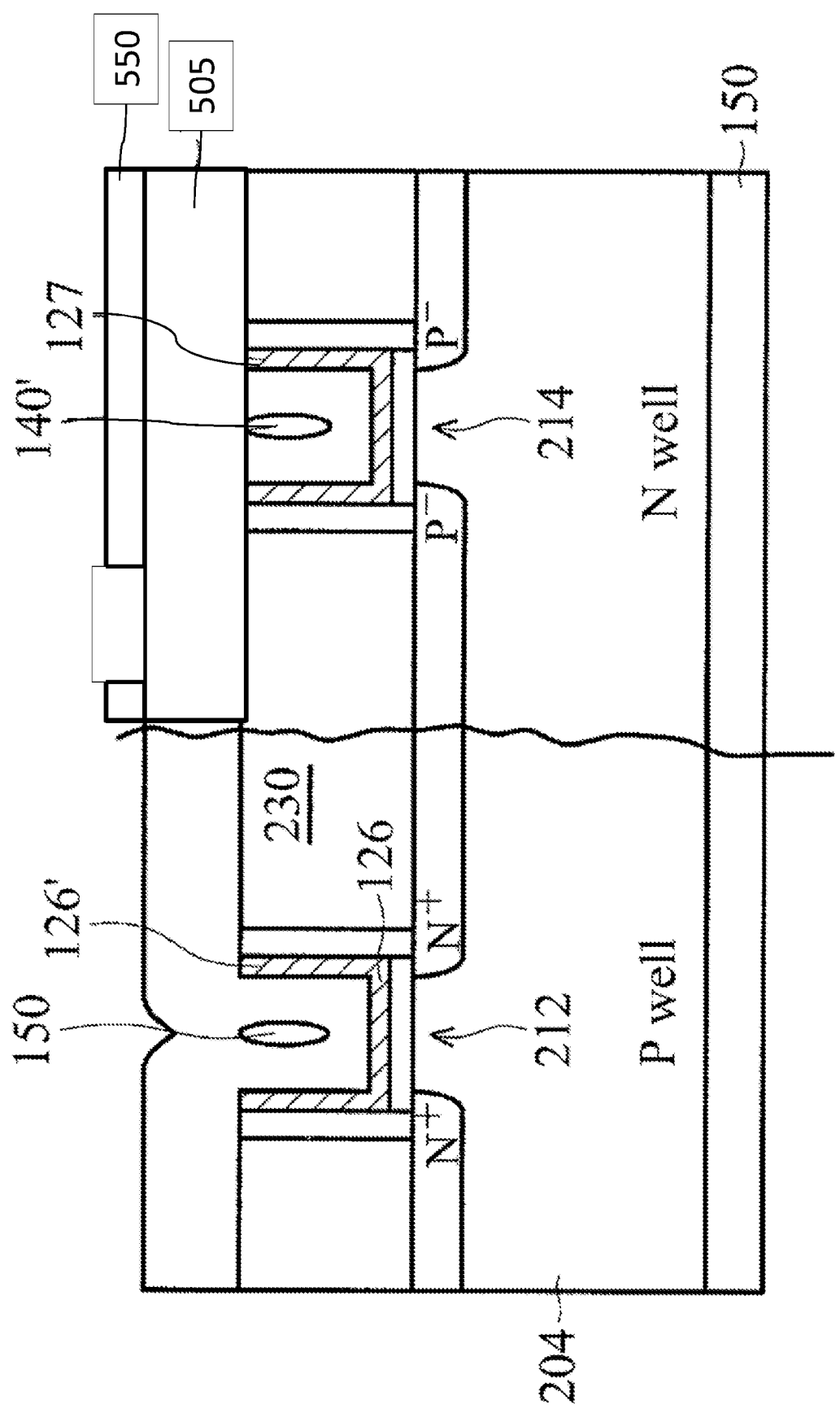
FIG. 5C shows a photoresist exposing a region of a local interconnect adjacent where a contact plug will be located, in accordance with one embodiment of this disclosure.

Alternatively, the methods and structures described above do not only apply to contacts on a word line of an SRAM with adjacent nFET or pFET devices. The methods and structures also apply to contact plugs landed on gate metal regions that are connected to the gate metal of an nFET or a pFET device structure. FIG. 5A shows a top view of a contact plug 506 landed on a gate metal line 505 that is used for local interconnect and is adjacent to a gate structure 501, in accordance with one embodiment of this disclosure. The device of the gate structure 501 can be an nFET device or a pFET device and has a source region $501_S$ and a drain region $501_D$. As shown in FIG. 5A, there is a void 540 formed in the gate metal line 505, which can be used as local interconnect to connect contact plug 506 to gate 501. The metal line 505 is not necessarily lined with a work function layer (not shown). As mentioned above in FIG. 1D, void 540 can be at least partially filled with the contact metal during its deposition. The contact metal protrudes along void 540 and comes in contact with the gate stack of gate 501, and consequently changes the work function of gate 501. FIG. 5C shows a photoresist 550 over metal line 505 and exposing a portion of metal line 505 where contact plug 506 will be located.

To prevent contact metal protrusion, the dummy polysilicon near and underneath contact plug 506 can be removed and the opening created by the removed dummy polysilicon can be lined with a work function layer with good sidewall coverage. FIG. 5B shows the dummy polysilicon surrounding contact plug 506 having been removed and the opening created being lined with a work function layer 527 with good sidewall coverage, in accordance with an embodiment of this disclosure. If gate 501 is an nFET, work function layer 527 is a P-type work function layer. In one embodiment, layer 527 is deposited by an ALD process, since ALD film has good step coverage. FIG. 5B shows that void 540 has been shrunk to void 540' and is not deposited with contact metal. There could be a void (not shown) under contact 506, but it's confined by the boundary that is protected by layer 527. Even when the void under contact 506 is filled or partially filled with contact metal, the protrusion is limited within the confinement of layer 527. Adding layer 527 to surround the gate metal around contact plug 506 does not affect the nature of metal line 525 as local interconnects, since layer 527 is conductive.

Figure 6:
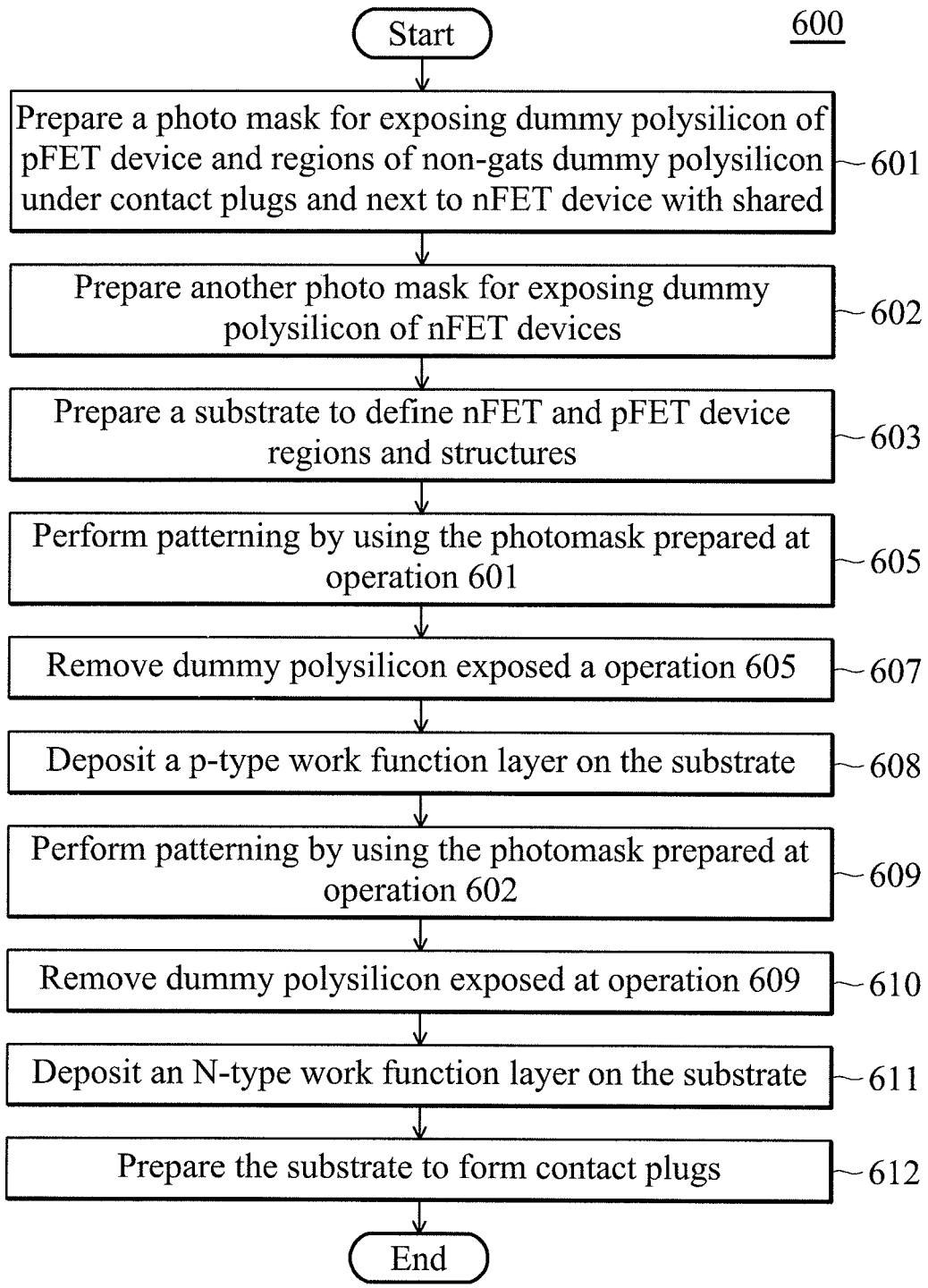
FIG. 6 shows a process flow of forming a semiconductor structure in accordance with one embodiment of this disclosure.

FIG. 6 shows a process flow 600 of forming a semiconductor structure in accordance with one embodiment of this disclosure. At operation 601, a photomask for exposing dummy polysilicon of pFET devices is prepared. The photomask also opens non-gate dummy polysilicon under contact plugs that are next to (or adjacent to) and are connected to (or share) the same dummy polysilicon regions of nFET devices. In one embodiment, the same dummy polysilicon regions are parts of word lines of one or more SRAM units. In one embodiment, an algorithm can be written to identify such non-gate dummy polysilicon regions to be exposed in order to prevent contact metal protrusion (or extrusion) in design layout. At operation 602, another photomask for exposing dummy polysilicon of nFET devices is prepared. In one embodiment, the photomask also opens non-gate dummy polysilicon under contact plugs that are next to (or adjacent to) and are connected to (or share) the same dummy polysilicon regions of pFET devices. In one embodiment, the same dummy polysilicon regions are parts of word lines of one or more SRAM units. In one embodiment, an algorithm can be written to identify such non-gate dummy polysilicon regions to be exposed in order to prevent contact metal protrusion (or extrusion) in design layout.

At operation 603, a substrate is prepared to define nFET and pFET device regions and structures, whose gates are filled with dummy polysilicon. At operation 605, patterning is performed on the substrate by using the photomask of operation 601 to open regions whose dummy polysilicon would be removed. At operation 607, dummy polysilicon of the exposed regions is removed. Operation 607 may include removing the photoresist on the substrate. At operation 608, a P-type work function layer is deposited to cover the substrate surface and side walls of the openings removed of dummy polysilicon. In one embodiment, the P-type work function layer is deposited by ALD. As mentioned above, in some embodiments the thickness of layer 127 (measured at the top surface of the substrate) is between about 10 Å to about 200 Å. Thicker layer 127 may also be used. Additional processing, such as depositing a spin-on-glass (SOG) layer on the substrate can be performed at operation 608.

After operation 608, patterning is performed at operation 609 by using the photomask of operation 602 to open regions whose dummy polysilicon would be removed at operation 609. As mentioned above, it is optional for the photomask created at operation 602 to include openings for non-gate dummy polysilicon to prevent contact metal protrusion. At operation 610, dummy polysilicon of the exposed regions at operation 609 is removed. At operation 611, an N-type work function layer is deposited on the substrate to line the openings. In one embodiment, the N-type work function layer covers sidewalls of the openings removed of dummy polysilicon. In one embodiment, the N-type work function layer is deposited by ALD. Operation 612 is practiced after operation 611 to prepare the substrate to form contact plugs. As noted above in the description of FIGS. 4A-4E, operation 612 may include filling the gate metal, such as Al, removing of dummy polysilicon of nFET devices, filling the nFET devices with N-type work function layer and gate metal layer, and/or forming contact plugs. Details of the process flow for defining devices by replacement gate process can be found in U.S. patent application Ser. No. 12/567,227, titled "Fabricating High-K/Metal Gate Devices in a Gate Last Process," filed on Sep. 25, 2009, which is incorporated by reference herein in its entirety.

In one embodiment, due to the protection of the P-type work function layer on the sidewalls of gate metal under contact plugs near nFET devices and share the gate metal, the contact metal (such as Tungsten) would not protrude into the gate metal regions of the nFETs nearby to affect their work functions. In another embodiment, due to the protection of the P-type work function layer and N-type work function layer on the sidewalls of gate metal under contact plugs near nFET and pFET devices and share the gate metal, the contact metal (such as Tungsten) would not protrude into the gate metal regions of the nFET and pFET devices nearby to affect their work functions.

For the method described above, in some embodiments, the photomask for exposing dummy polysilicon of pFET devices also opens non-gate dummy polysilicon under contact plugs that are next to (or adjacent to) and are connected to (or share) the same dummy polysilicon regions of nFET devices. In some embodiments, it is optional for the photomask for exposing dummy polysilicon of nFET devices to open non-gate dummy polysilicon under contact plugs that are next to (or adjacent to) and are connected to (or share) the same dummy polysilicon regions of pFET devices. Alternatively, the photomask for exposing dummy polysilicon of nFET devices also opens non-gate dummy polysilicon under contact plugs that are next to (or adjacent to) and are connected to (or share) the same dummy polysilicon regions of pFET devices. And in some embodiments, it is optional for the photomask for exposing dummy polysilicon of pFET devices to open non-gate dummy polysilicon under contact plugs that are next to (or adjacent to) and are connected to (or share) the same dummy polysilicon regions of nFET devices.

The process sequence described above in FIG. 6 patterns and removes dummy polysilicon of pFET devices first and dummy polysilicon of nFET devices later. Alternatively, dummy polysilicon of nFET devices can be removed first and dummy polysilicon of pFET devices afterwards. In addition, the process flow 600 described above allows prevention of tungsten (or contact metal) protrusion to affect work functions of nFET devices, pFET devices, and a combination of both devices, depending what types of patterning masks being use for dummy polysilicon removal.

The methods and structures described above are used to prevent protrusion of contact metal (such as tungsten) horizontally into gate stacks of neighboring devices to affect the work functions of these neighboring devices. In some embodiments, if the contact plugs and neighboring devices are part of SRAM and are on a word line, the protruded tungsten can increase SRAM Vcc min. The metal gate under contact plugs that are adjacent to devices and share the (or are connected to) metal gate is defined and lined with a work function layer that has good step coverage to prevent contact metal from extruding into gate stacks of neighboring devices. In some embodiments, only modification to the mask layout for the photomask(s) used for removing dummy polysilicon is involved. No additional lithographical operation or mask is needed. Therefore, no modification to the manufacturing processes or additional substrate processing steps (or operations) is involved or required. The benefits of using the methods and structures described above may include increased device yield and performance.

In one embodiment, a method of preventing contact metal from protruding into neighboring gate devices to affect work functions of the neighboring gate devices is provided. The method includes an operation of preparing a photomask for exposing dummy polysilicon in gate structures of P-type field effect transistors (pFETs). The photomask is also used to expose dummy polysilicon of regions of local interconnect that are under contact plugs and are adjacent to gate structures of N-type field effect transistors (nFETs) connected to the regions of local interconnect. The method also includes an operation of processing a substrate to define device regions and structures of the pFETs and the nFETs. The gate structures of the pFETs and the nFETs and the local interconnect are deposited with a layer of dummy polysilicon. The method further includes an operation of patterning the substrate to expose the dummy polysilicon in gate structures of pFETs and in the regions of local interconnect, and an operation of removing the exposed dummy polysilicon in gate structures of pFETs and in the regions of local interconnect. In addition, the method includes an operation of depositing a P-type work function layer on the substrate with openings removed of the exposed dummy polysilicon in the gate structures of pFETs and in the regions local interconnect. The P-type work function layer covers the sidewalls of the openings and prevents contact metal from protruding into the gate structures of nFETs connected to the regions of local interconnect to affect their work functions.

In another embodiment, a method of preventing contact metal from protruding into neighboring gate devices to affect work functions of the neighboring gate devices is provided. The method includes an operation of preparing a photomask for exposing dummy polysilicon in gate structures of N-type field effect transistors (nFETs). The photomask is also used to expose dummy polysilicon of regions of local interconnect that are under contact plugs and are adjacent to gate structures of P-type field effect transistors (pFETs) connected to the regions of local interconnect. The method also includes an operation of processing a substrate to define device regions and structures of the pFETs and the nFETs. The gate structures of the pFETs and the nFETs and the local interconnect are deposited with a layer of dummy polysilicon. The method further includes an operation of patterning the substrate to expose the dummy polysilicon in gate structures of nFETs and in the regions of local interconnect, and an operation of removing the exposed dummy polysilicon in gate structures of nFETs and in the regions of local interconnect. In addition, the method includes an operation of depositing an N-type work function layer on the substrate with openings removed of the exposed dummy polysilicon in the gate structures of nFETs and in the regions local interconnect. The N-type work function layer covers the sidewalls of the openings and prevents contact metal from protruding into the gate structures of pFETs connected to the regions of local interconnect to affect their work functions.

In yet another embodiment, a method of preventing contact metal from protruding into neighboring gate devices to affect work functions of the neighboring gate devices is provided. The method includes forming a gate structure. Forming the gate structure includes forming a work function layer, and forming a gate metal layer having a void, wherein the work function layer surrounds the gate metal layer. The method further includes forming a contact plug having a contact metal directly on the gate metal layer of the first gate stack, wherein the contact metal protrudes into the void, and the work function layer prevents the contact metal from protruding into a second gate stack.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed:

1. A method of preventing a contact metal from protruding into neighboring gate devices to affect work functions of the neighboring gate devices, comprising:
   exposing dummy polysilicon in a gate structure of each of P-type field effect transistors (pFETs) on a substate;
   exposing dummy polysilicon of regions of a local interconnect that are under contact plugs and are adjacent to a gate structure of each of N-type field effect transistors (nFETs), wherein the nFETs are connected to the regions of the local interconnect, and the regions of the local interconnect and neighboring nFETs of the nFETs are on same word lines of a static random access memory (SRAM) cell;
   removing the exposed dummy polysilicon in the gate structure of each of the pFETs and in the regions of the local interconnect;
   depositing a P-type work function layer on the substrate with openings resulting from removal of the exposed dummy polysilicon in the gate structure of each of the pFETs and in the regions of the local interconnect, wherein the P-type work function layer covers sidewalls of the openings and prevents the contact metal from protruding into the gate structure of each of the nFETs connected to the regions of the local interconnect to affect the work functions of the gate structure of each of the nFETs;
   forming a gate metal layer on the P-type work function layer and having a void in the gate structure of each of the pFETs; and
   forming a contact plug of the contact plugs over the gate metal layer in the gate structure of each of the pFETs, wherein the contact plug of the contact plugs protrudes into the void.

2. The method of claim 1, wherein the contact metal is tungsten deposited by chemical vapor deposition (CVD).

3. The method of claim 1, wherein the pFETs and the nFETs are prepared with replacement gate process.

4. The method of claim 1, wherein the P-type work function layer has a thickness between about 10 Å to about 100 Å.

5. The method of claim 1, wherein the P-type work function layer is made of a material selected from a group consisting of TiN, WN, TaN, Re, Fe, Ru, Co, Rh, Ir, Ni, Pd, and Pt.

6. The method of claim 1, wherein the P-type work function layer is deposited by atomic layer deposition (ALD) to provide good step coverage on the sidewalls in the openings.

7. The method of claim 6, wherein a minimal thickness of the P-type work function layer on the sidewalls of the openings resulting from removal of the exposed dummy polysilicon in the regions of the local interconnect is about 10 Å.

8. A method of preventing a contact metal from protruding into neighboring gate devices to affect work functions of the neighboring gate devices, comprising:
    exposing dummy polysilicon in a gate structure of each of N-type field effect transistors (nFETs) on a substrate;
    exposing dummy polysilicon of regions of a local interconnect that are under contact plugs and are adjacent to a gate structure of each of P-type field effect transistors (pFETs), wherein the pFETs are connected to the regions of the local interconnect, and the local interconnect connects to the gate structure of a pFET of the pFETs and the gate structure of an adjacent nFET of the nFETs;
    removing the exposed dummy polysilicon in the gate structure of each of the nFETs and in the regions of the local interconnect;
    depositing an N-type work function layer on the substrate with openings resulting from removal of the exposed dummy polysilicon in the gate structure of each of the nFETs and in the regions of the local interconnect, wherein the N-type work function layer covers sidewalls of the openings and prevents the contact metal from protruding into the gate structure of each of the pFETs connected to the regions of the local interconnect to affect the work functions of the gate structure of each of the nFETs;
    forming a gate metal layer having a void in the gate structure of each of the pFETs; and
    forming a contact plug of the contact plugs over the gate metal layer in the gate structure of each of the pFETs, wherein the contact plug of the contact plugs protrudes into the void.

9. The method of claim 8, wherein the N-type work function layer is made of a material is selected from a group consisting of TiAl, Ti, Ag, Al, TiAlN, TaC, TaCN, TaSiN, Mn, and Zr.

10. The method of claim 8, further comprising:
    depositing a P-type work function layer on the substrate with the openings resulting from removal of the exposed dummy polysilicon in the gate structure of each of the pFETs and in the regions of the local interconnect before the step of forming the gate metal layer, wherein the P-type work function layer covers the sidewalls of the openings.

11. The method of claim 10, wherein the P-type work function layer surrounds the gate metal layer in the gate structure of each of pFETs, and the P-type work function layer prevents the contact metal from protruding into the gate structure of each of the nFETs.

12. The method of claim 10, further comprising:
    forming a gate metal layer on the N-type work function layer and having a void in the gate structure of each of the nFETs, wherein the N-type work function layer surrounds the gate metal layer in the gate structure of each of the nFETs; and
    forming a contact plug of the contact plugs over the gate metal layer in the gate structure of each of the nFETs, wherein the contact plug of the contact plugs protrudes into the void, and the N-type work function layer prevents the contact metal from protruding into the gate structure of each of the pFETs.

13. The method of claim 12, wherein forming the gate metal layer in the gate structure of each of the nFETs comprises forming an aluminum gate metal layer.

14. The method of claim 12, further comprising connecting the contact plug of the contact plugs to a word line of a static random access memory (SRAM) cell.

15. The method of claim 10, wherein depositing the P-type work function layer is performed prior to depositing the N-type work function layer.

16. The method of claim 8, wherein depositing the N-type work function layer comprises performing at least one of an atomic layer deposition (ALD) process, a physical vapor deposition (PVD) process, or a chemical vapor deposition (CVD) process.

17. The method of claim 8, wherein patterning the substrate to expose the dummy polysilicon the gate structure of each of the nFETs comprises:
    forming a photoresist layer over a surface of the substrate; and
    forming an opening in the photoresist layer exposing the dummy polysilicon in the gate structure of each of the nFETs.

18. The method of claim 8, wherein removing the exposed dummy polysilicon in the gate structure of each of the nFETs comprises performing at least one of a dry etching or a wet etching process.

19. A method of preventing a contact metal from protruding into neighboring gate devices to affect work functions of the neighboring gate devices, the method comprising:
    forming a first gate structure, wherein forming the first gate structure comprises:
        forming a work function layer, and
        forming a gate metal layer having a void, wherein the work function layer surrounds the gate metal layer; and
    forming a contact plug having the contact metal directly on the gate metal layer of the first gate structure, wherein the contact metal protrudes into the void, and the work function layer prevents the contact metal from protruding into a second gate stack.

20. The method of claim 1, wherein the local interconnect connects to the gate structure of a pFET of the pFETs and the gate structure of an adjacent nFET of the nFETs.

* * * * *